(12) United States Patent
Woo et al.

(10) Patent No.: US 9,590,435 B2
(45) Date of Patent: Mar. 7, 2017

(54) BATTERY CHARGING STATUS INDICATOR FOR ELECTRIC VEHICLE

(71) Applicants: Hyundai Motor Company, Seoul (KR); Kia Motors Corporation, Seoul (KR)

(72) Inventors: Jung Hoon Woo, Hwaseong-si (KR); Heon Cheol Kim, Goyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 14/931,469

(22) Filed: Nov. 3, 2015

(65) Prior Publication Data

US 2016/0233706 A1 Aug. 11, 2016

(30) Foreign Application Priority Data

Feb. 5, 2015 (KR) ........................ 10-2015-0017790

(51) Int. Cl.
| B60Q 1/00 | (2006.01) |
| H02J 7/00 | (2006.01) |
| B60Q 9/00 | (2006.01) |
| H01L 21/00 | (2006.01) |

(52) U.S. Cl.
CPC ............. *H02J 7/0047* (2013.01); *B60Q 9/00* (2013.01); *H01L 21/00* (2013.01); *H02J 2007/005* (2013.01)

(58) Field of Classification Search
CPC .............................. H01L 21/00; F21Y 2101/00
See application file for complete search history.

(56) References Cited

U.S. PATENT DOCUMENTS

| 8,632,196 B2 | 1/2014 | Tong et al. | |
| 2002/0105801 A1 | 8/2002 | Martineau | |
| 2009/0114934 A1* | 5/2009 | Horng | H01L 33/60 257/98 |
| 2011/0215700 A1* | 9/2011 | Tong | F21K 9/135 313/46 |
| 2013/0021162 A1* | 1/2013 | DeBoer | B60L 11/1824 340/635 |
| 2013/0120982 A1* | 5/2013 | Ko | F21V 13/02 362/235 |
| 2014/0170090 A1* | 6/2014 | Thaggard | A61K 8/8152 424/59 |

FOREIGN PATENT DOCUMENTS

| JP | 2002-93206 A | 3/2002 |
| JP | 2007-108786 A | 4/2007 |
| JP | 2008-509437 A | 3/2008 |
| JP | 2009-86436 A | 4/2009 |
| JP | 2011-182563 A | 9/2011 |
| JP | 5198914 B2 | 2/2013 |
| KR | 20-0462203 Y1 | 8/2012 |
| KR | 10-1355139 B1 | 1/2014 |

\* cited by examiner

*Primary Examiner* — Shirley Lu
(74) *Attorney, Agent, or Firm* — Morgan, Lewis & Bockius LLP

(57) ABSTRACT

A charging status indicator of an electric vehicle installed at one side of a charging status indicator cover to indicate a charging status of the electric vehicle as an illumination may include a lens-integrated lamp housing and a printed circuit board (PCB) housing which are vertically coupled to each other, a PCB installed in the PCB housing and having a plurality of Light Emitting Diodes (LEDs) mounted thereon, and a diffusion cap diffusing LED.

11 Claims, 6 Drawing Sheets

[Cross section taken along line A-A]

[Cross section taken along line B-B]

BATTERY CHARGING STATUS INDICATOR FOR ELECTRIC VEHICLE

CROSS-REFERENCE TO RELATED APPLICATION

The present application claims priority to Korean Patent Application No. 10-2015-0017790 filed Feb. 5, 2015, the entire contents of which is incorporated herein for all purposes by this reference.

BACKGROUND OF THE INVENTION

Field of the Invention

The present invention relates to a battery charging status indicator for an electric vehicle, and more particularly, to a battery charging status indicator for an electric vehicle which indicates a charging status of the electric vehicle by a lighting sequence of a plurality of indicator lenses or a color change of one indicator lens.

Description of Related Art

Generally, an electric vehicle includes a charging apparatus including a charging connector for charging a battery, a lamp for indicating whether the battery charging is completed, and the like.

A charging complete indicator lamp is provided at a position where the charging connector exists, and generally configured by an ON/OFF type lamp and thus a charging operator may verify a charging complete status according to a lighting of the lamp.

However, in the case of the charging complete indicator lamp, it is difficult for the charging operator to verify a current charging amount. As a result, there are disadvantages in that a standby state needs to be maintained at all times during the charging operation and it is difficult for the driver in the vehicle to recognize the charging situation because the charging complete indicator lamp is positioned outside the vehicle.

In order to solve the problem, recently, a technique has been gradually applied, which allows a driver to easily recognize a battery charging status by installing a separate display device such as a charging status indicator on an instrument panel in the vehicle.

For example, recently, as the charging status indicator, a type which recognizes the charging status of the electric vehicle by the lighting sequence of a plurality of indicator lenses or color conversion of a united indicator lens has been generally applied.

However, in a charging status indicator in the related art, there are many disadvantages in that a distance when light irradiated from the Light Emitting Diode (LED) reaches the lens is not uniform, illumination uniformity deteriorates, the degree of freedom of the design is low according to the design shape constraints and a dissipation effect is slight and thus durability of an electronic circuit deteriorates, and a vague reflection is generated in a wind shield glass by a lens white color to interfere with a driver's view.

That is, the charging status indicator in the related art has insufficient points from the viewpoint that brightness of lens light is maximized and there is no vague reflection in a glass and the like in order to ensure day visibility of the driver for verifying a battery charging status and uniformity of the illumination needs to be ensured in order to improve marketability.

As an example, the charging status indicator in the related art is configured by a lamp housing 140 assembled with an indicator cover 110 with which an indicator lamp 100 is assembled, an indicator lens 120, and a Printed Circuit Board (PCB) 130, an indicator lens 120 for transferring light irradiated from the LED 150 through the lens and lighting-on the lamp for each charging status, a PCB 130 to which an LED 150 is attached, and a PCB housing 160 having a heat flow through-hole for discharging heat generated from the LED 150 and the PCB 130.

However, the charging status indicator in the related art has the following problems.

First, there is a problem with an excessive number of components and an excessive number of assembling holes by applying a separate lamp housing fixing the indicator lens and the PCB.

Second, there are problems in that costs increase by applying each lens and many LEDS thereof in order to separately light-on the lamp for each charging status, a vague reflection occurs in the wind shield glass by applying a white color lens in order to ensure illumination brightness of the lamp to interfere with a driver's view and marketability deteriorates because the internal LED light source is shown.

Third, there is a problem in that cost increases by applying excessive LEDs in order to ensure day visibility.

Fourth, there is a problem in that efficiency deteriorates as compared with a thermal conductive dissipation structure as a heat convection dissipation structure through a heat flow through-hole.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a charging status indicator of an electric vehicle in which in order to solve non-uniformity of a point light source of Light Emitting Diode (LED)-irradiated light which is projected to a lens portion due to design shape constraints (an aspherical surface), the light irradiated from the LED becomes a surface-emitting light source when reaching the lens portion through diffused reflection in the diffusion cap by applying a light diffusion cap to the bottom of the lens to ensure uniformity of the illumination.

Further, various aspects of the present invention are directed to providing a charging status indicator of an electric vehicle in which a heat conductivity dissipating type which emits heat generated from the LED and a microcomputer is applied to ensure electrical performance durability safety.

According to various aspects of the present invention, a charging status indicator of an electric vehicle installed at one side of a charging status indicator cover to indicate a charging status of the electric vehicle as an illumination may include a lens-integrated lamp housing and a printed circuit board (PCB) housing which are vertically coupled to each other, a PCB installed in the PCB housing and having a plurality of Light Emitting Diodes (LEDs) mounted thereon, and a diffusion cap diffusing LED light irradiated to a lens side of the lamp housing while covering the LED on the PCB.

A pattern portion for diffusing the LED light may be formed at a bottom of the diffusion cap.

The pattern portion may include a sparse pattern portion formed in a region corresponding to the LED position to have a relatively small number of patterns, and a dense pattern portion formed in a region corresponding to a position between the LEDs to have a relatively large number of patterns.

The lens of the lamp housing may be formed in a quadrangular projection shape, and an upper end of the diffusion cap may be received in the lens and closely positioned therein.

The lens of the lamp housing may be a black smog lens in order to solve a vague reflection problem.

A heat sink thermal conductive film which transfers heat generated from the LED and a microcomputer configured to be attached on the PCB to a heat sink side formed at a bottom of the PCB housing may be attached to a bottom of the PCB and dissipation may be performed by a thermal conducting method, thereby ensuring durability of the internal electronic element by maximizing heat transfer efficiency.

The LED may be a Red, Green, Blue (RGB) LED in which a charging status is indicated through color conversion.

Accordingly, the charging status indicator of the electric vehicle may perform LED dissipation by uniformity and conduction of a lens illumination using the diffusion cap.

The charging status indicator of the electric vehicle provided in the present invention has the following effects.

First, the indicator lens and the housing are integrally configured to reduce assembling cost by reducing the number of components and reducing the number of assembling holes.

Second, the charging status by the lighting sequence of the lens is indicated as the charging status by the color conversion by applying the RGB LED to reduce 50% of the number of LEDs, thereby reducing costs due to reduction of the number of components.

Third, a vague reflection problem in the wind shield glass generated due to the application of a white color in the related art may be solved by applying the black smog color to the lens, and the exposure of the internal light source may be prevented.

Fourth, in order to solve non-uniformity of lens light due to a point illumination of a light source irradiated from the LED light source, a diffusion cap of a white color having diffusion is applied, and in order to maximize uniformity of a surface illumination transferred to the lens portion at the bottom of the diffusion cap, a sparse optical pattern may be applied in a close region to the light source and a dense optical pattern may be applied in a far region from the light source.

Fifth, in the case of the PCB & LED, the RGB LED for indicating the charging status due to color conversion is attached.

Sixth, heat generated in the LED and the microcomputer attached on the PCB is conducted to the PCB housing, and thus heat transfer efficiency is maximized as compared with an existing heat convection method for transferring the heat and it is effective in durability of an internal electronic element.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example, both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
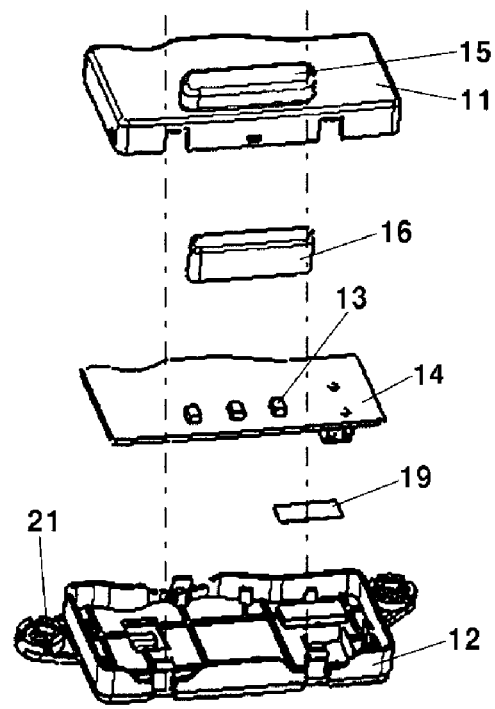
FIG. 1 is an exploded perspective view illustrating an exemplary charging status indicator of an electric vehicle according to the present invention.
Figure 2:
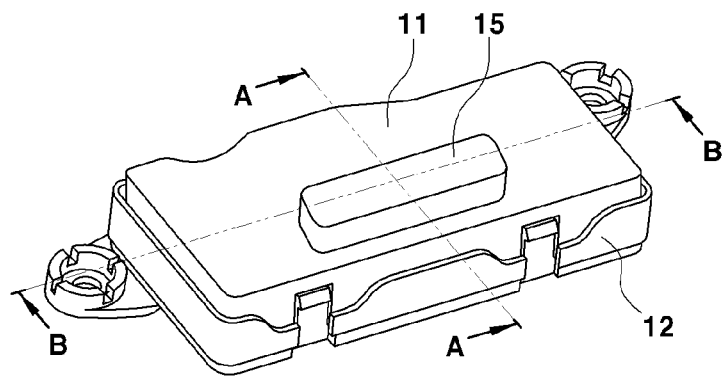
FIG. 2 is a coupled perspective view illustrating the exemplary charging status indicator of the electric vehicle according to the present invention.
Figure 3:
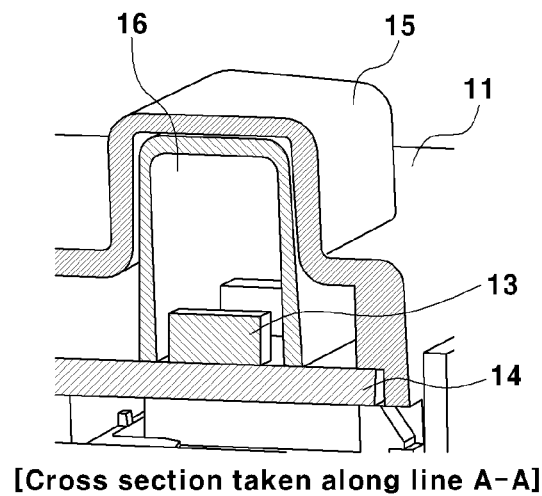
FIG. 3 is a cross-sectional view taken along line A-A of FIG. 2.
Figure 4:
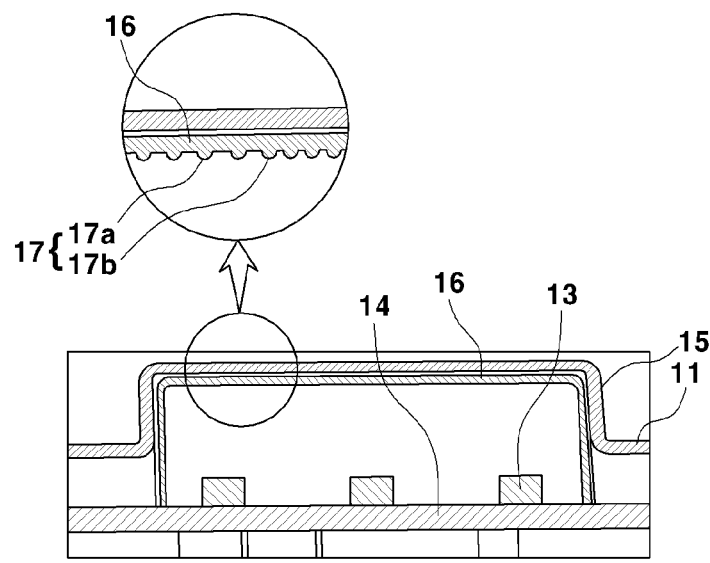
FIG. 4 is a cross-sectional view taken along line B-B of FIG. 2.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

FIGS. 1 to 4 are perspective views and cross-sectional views illustrating a charging status indicator of an electric vehicle according to various embodiments of the present invention.

As illustrated in FIGS. 1 to 4, in order to solve non-uniformity of Light Emitting Diode (LED)-irradiated light which is projected to a lens according to a design shape constraints (an aspherical surface) due to a point light source, in the charging status indicator when a light diffusion cap is applied to a bottom (inner portion) of the lens, the light irradiated from the LED causes a diffused reflection inside the diffusion cap to become a surface-emitting light source when reaching the lens and ensure uniformity of the illumination. Meanwhile, in order to maximize the uniformity of the illumination, the charging status indicator is configured by a structure in which optical patterns are sparsely applied to the LED vicinity portion and densely applied to an LED distance portion, and a heat conductivity dissipating type which emits heat generated from the LED and a microcomputer is applied at the bottom of the diffusion cap.

To this end, the charging status indicator includes a lens-integrated lamp housing 11 and a printed circuit board (PCB) housing 12 which are vertically coupled with each other while making a space therein, and a combination shape of the lamp housing 11 and the PCB housing 12 which are coupled with each other has a square box shape.

The lens 15 is integrally projected on the upper surface of the lamp housing 11, and in this case, an edge portion of the lens 15 has a rounded square shape.

That is, in the lens 15, an upper plate of the lamp housing 11 has a square shape and has an uplifted shape.

The lens 15 has a black smog lens type, and as a result, even in the case where the lens 15 is installed at a position adjacent to the lower end of the wind shield glass in the vehicle room, a vague reflection problem does not occur.

In addition, the PCB housing 12 is a part of receiving a PCB 14 and the like, and a metallic heat sink (reference numeral 18 of FIG. 5) made of an aluminum material and the like which is configured by a rib structure arranged in parallel is formed at the bottom of the housing.

The heat sink 18 serves to discharge heat generated from the LED 13 and the microcomputer to the outside.

Further, the charging status indicator includes the PCB 14 having the LED 13 as a means substantially indicating a charging status.

A plurality of LEDs 13 is mounted on one side of the PCB 14, and in this case, the LED 13 may be electrically connected to the PCB side.

Several LEDs 13 are provided to be parallel to each other in series, for example, three LEDs are provided to be parallel to each other in series. The PCB 14 is installed in the PCB housing 12, and three LEDs 13 which are arranged in series while the lamp housing 11 is coupled thereon may be positioned directly under the lens 15.

Here, a Red, Green, Blue (RGB) LED type which can indicate a charging status through color conversion may be applied to the LED 13, and each LED 13 may indicate the charging status through a lighting sequence or color conversion.

In this case, since a method of controlling the lighting sequence or the color conversion of the LED for indicating the charging status is the same as that in the related art, a detailed description thereof will be omitted.

Particularly, the charging status indicator includes a diffusion cap 16 as a means which diffuses LED light irradiated to the lens 15 side of the lamp housing 11 and promotes uniformity of the lens illumination.

The diffusion cap 16 as a rectangular cap which is similar to the lens shape is installed as a structure which is fixed and placed to the upper surface of the PCB 14 to cover the upper portion including the LED 13.

Here, the diffusion cap 16 is received inside the lens 15 having the quadrangular projection shape at the upper end, and the inner surface of the lens 15 may be positioned to be close to the outer surface of the upper end of the diffusion cap through a peripheral region of the upper surface and the side.

Further, a pattern portion 17 for diffusing the LED light is formed on the bottom of the diffusion cap 16, and in the case, the pattern portion 17 may be formed in a dotted shape such as a convex shape or a concave shape.

In addition, the pattern portion 17 may be configured by a sparse pattern portion 17a and a dense pattern portion 17b where the number of patterns is relatively small and large therebetween.

That is, the sparse pattern portion 17a has a relatively small number of patterns (e.g. the number of dots) as compared with the dense pattern portion 17b, and similarly, the dense pattern portion 17b has a relatively large number of patterns as compared with the sparse pattern portion 17a.

The sparse pattern portion 17a is formed in a region corresponding to a directly upper portion of a portion where the LED 13 is positioned in the upper region of the diffusion plate, and further, the dense pattern portion 17b is formed in a region corresponding to a directly upper portion between the LEDs 13 which are adjacent to each other.

Of course, an interface between the sparse pattern portion 17a and the dense pattern portion 17b may be considerably partitioned, but the sparse pattern portion 17a and the dense pattern portion 17b may be combined in a form where the number of patterns is gradually increased or decreased toward the each pattern portion region based on the interface.

Further, in the diffusion cap 16, a rapidly changed portion of the cross-section of the lens 15, that is, an edge portion (a corner portion) is formed in a rounded shape, and as a result, due to reduction of a refractive index difference, uniform distribution of light irradiation may improve a shaded edge and increase a volume of the lens.

Figure 5:
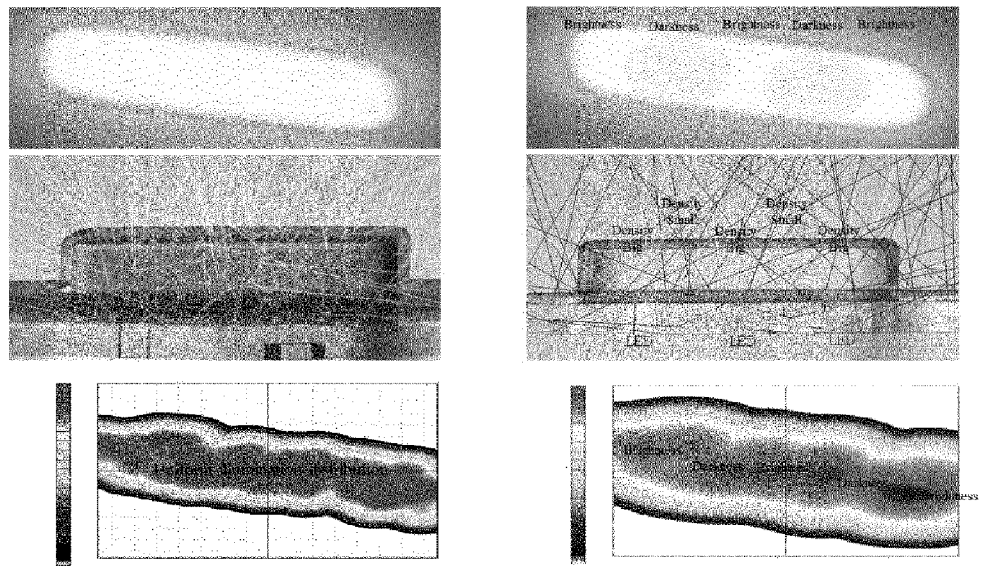
FIG. 5 is a schematic view illustrating an illumination distribution state when a diffusion cap is applied or not applied to the exemplary charging status indicator of the electric vehicle according to the present invention.

FIG. 5 is a schematic view illustrating an illumination distribution state when a diffusion cap is applied or not to the charging status indicator of the electric vehicle according to various embodiments of the present invention.

As illustrated in FIG. 5, generally, due to a distance between LEDs inside the lens and a difference in a reaching distance from a light source to the lens as a lens quadrangular shape (design constraint), in a lens region which is close to the LED, the light source irradiation density is large and the LED is bright, and in a lens region (a region between the LEDs) which is not close to the LED, the irradiation density is small, and as a result, the non-uniformity occurs at the entire portion of the lens.

That is, as illustrated in a right photograph of the drawing, as an optical analysis result of the illumination, the same analysis result as the actual illumination shade may be shown.

In order to solve the illumination shade, when the shape of the lens is implemented as a concentric hemispherical shape at the LED light source, there is no rapid change of the cross section and uniform illumination may be ensured without an illumination loss due to the refractive index, but there is a difficulty with the design shape constraints.

Meanwhile, as illustrated in a left photograph of the drawing, in the present invention, a diffusion cap having a white color having diffusion is applied, and as a result, when the light irradiated from the LED is transferred to the lens by the diffused reflection inside the diffused cap, a point illumination is changed into a surface illumination to solve a non-uniformity problem of the illumination due to the design shape constraints.

Further, in order to maximize the uniformity of the illumination, at the bottom of the diffusion cap, the optical pattern is sparsely reflected to the LED vicinity portion and densely reflected to the LED distance portion, thereby maximizing uniformity of the illumination.

Figure 6:
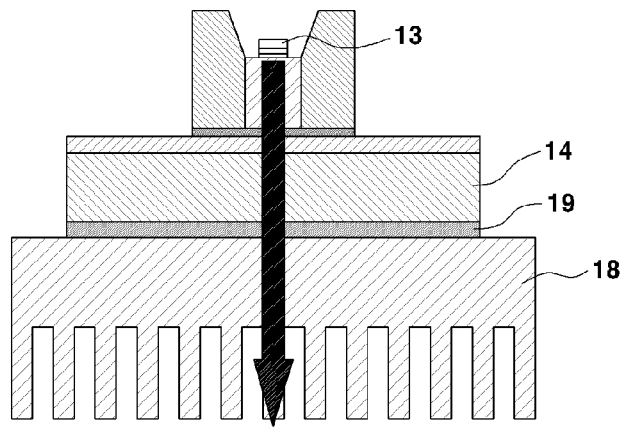
FIG. 6 is a cross-sectional view illustrating a heat sink in the exemplary charging status indicator of the electric vehicle according to the present invention.

FIG. 6 is a cross-sectional view illustrating a heat sink in the charging status indicator of the electric vehicle according to various embodiments of the present invention.

As illustrated in FIG. 6, here, a structure in which heat generated from the LED 13 attached to the PCB 14 is discharged by a heat conducting method is illustrated.

That is, a heat sink 18 is applied to a part or the entire area of the bottom plate of the PCB housing 12, and a heat sink thermal conductive film 19 is attached to the bottom of the PCB 14 which is seated and coupled to the bottom plate of the PCB housing 12.

Accordingly, between the PCB 14 and the bottom of the PCB housing 12, that is, the upper surface of the heat sink 18, the heat sink thermal conductive film 19 is interposed, and as a result, heat generated from the LED 13 and the like may be directly conducted to the heat sink 18 at the PCB housing side through the heat sink thermal conductive film 19 to be discharged to the outside. Finally, heat transfer efficiency is maximized by applying a heat transfer method [conduction heat transfer constant: 0.17 (k, W/m·K)] as compared with an existing convection method [convection heat transfer constant: 0.024 (k, W/m·K)], thereby ensuring durability of an internal electronic element.

Figure 7A:
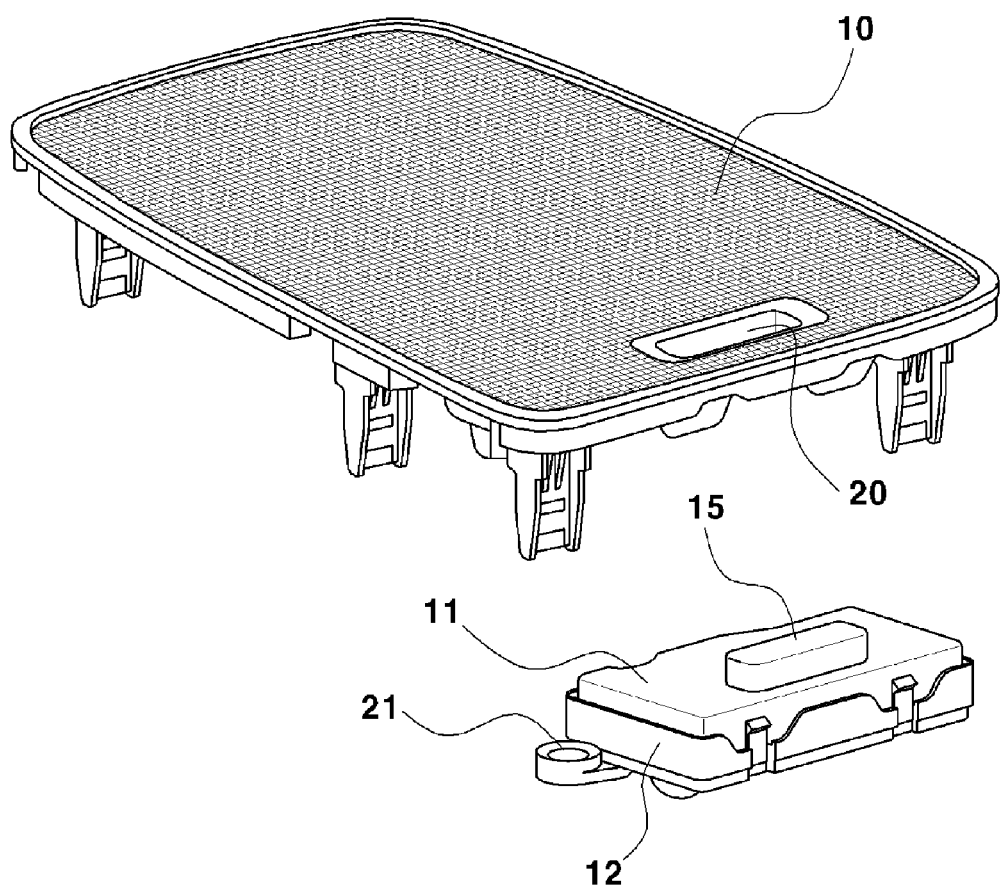
FIG. 7A and FIG. 7B are perspective views illustrating an installation state of the charging status indicator of the electric vehicle according to the present invention.
Figure 7B:
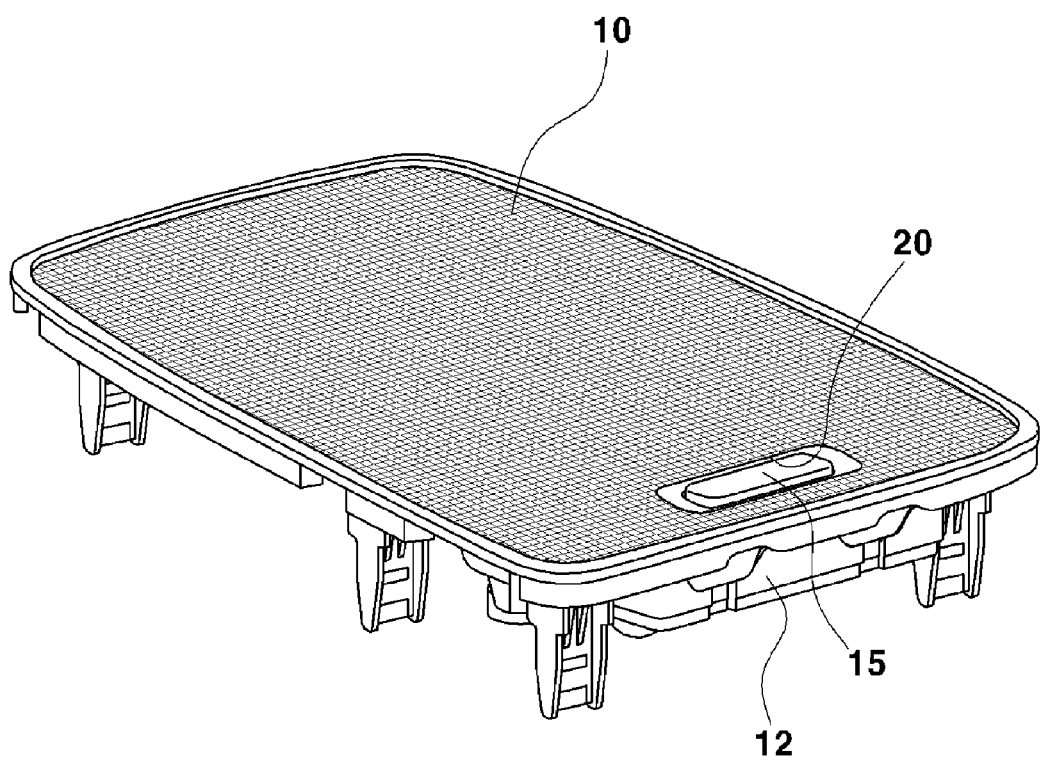
Figure 8:
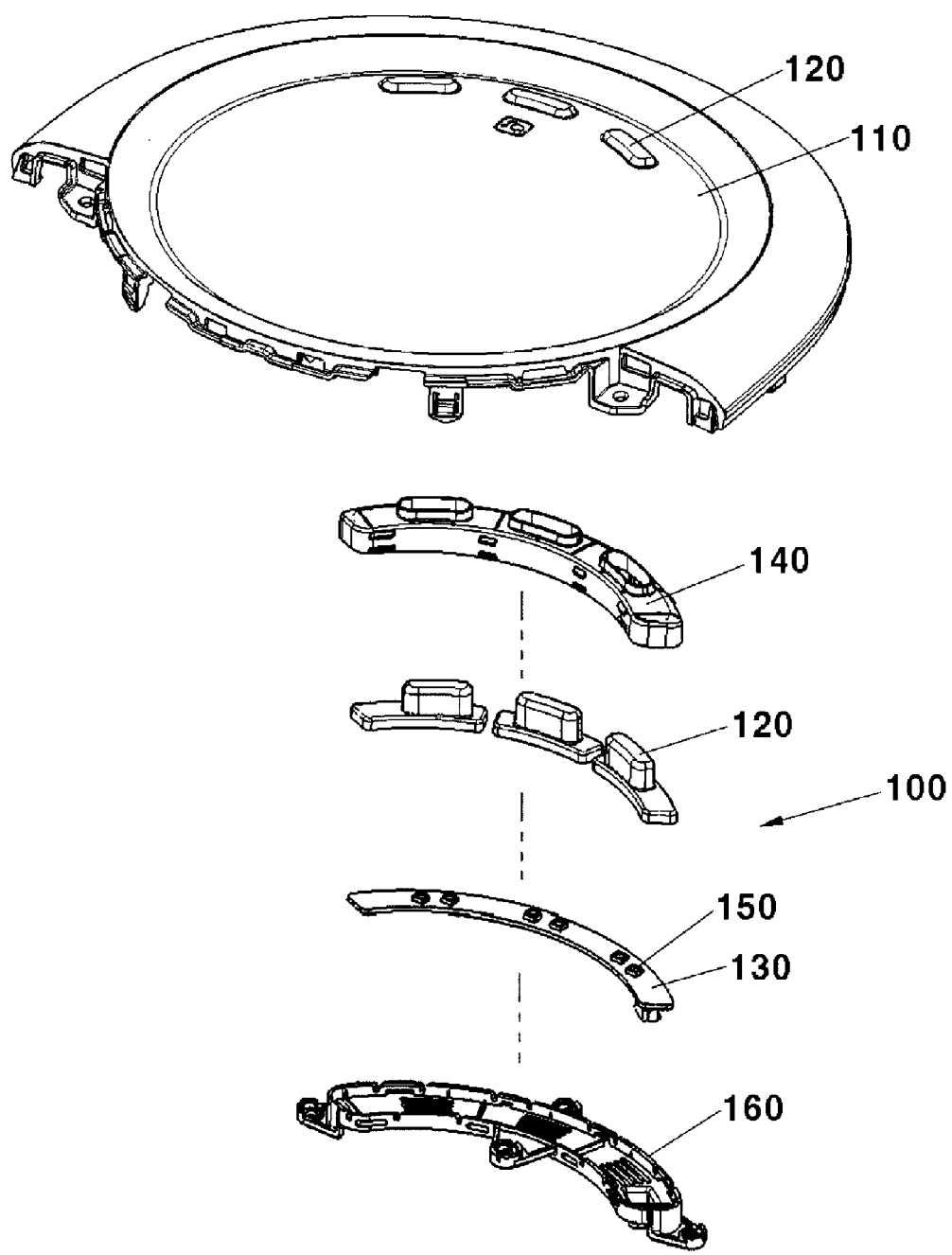
FIG. 8 is an assembled view and an exploded view illustrating a charging status indicator in the related art.

FIG. 7A and FIG. 7B are perspective views illustrating an installation state of the charging status indicator of the electric vehicle according to various embodiments of the present invention.

As illustrated in FIG. 7A and FIG. 7B, the charging status indicator is installed to be assembled to one side of the bottom of a charging status indicator cover 10 having a speaker grill function.

That is, a quadrangular lens through-hole 20 is formed at one edge portion of the charging status indicator cover 10, the charging status indicator is installed as a fastening structure at the bottom of the charging status indicator cover 10 through a bracket 21 and the like, and in this case, the lens 15 of the charging status indicator is exposed to the outside (the top) through the lens through-hole 20 included in the charging status indicator cover 10.

Accordingly, during charging of the electric vehicle, a driver may easily recognize the charging status through a lighting sequence of the lens or color conversion of the lens.

As such, in the present invention, the LED point illumination using the diffusion cap is changed into the surface-emitting illumination to attempt illumination uniformity of the charging status indicator and maximize illumination uniformity by applying the optical pattern, and durability of the internal electronic element may be ensured by applying a dissipation structure due to the thermal conducting method.

For convenience in explanation and accurate definition in the appended claims, the terms "upper" or "lower", "inner" or "outer" and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A charging status indicator of an electric vehicle installed at one side of a charging status indicator cover to indicate a charging status of the electric vehicle as an illumination, the indicator comprising:
   a lens-integrated lamp housing and a printed circuit board (PCB) housing vertically coupled to each other;
   a PCB installed in the PCB housing and having a plurality of Light Emitting Diodes (LEDs) mounted thereon; and
   a diffusion cap diffusing LED light irradiated to a lens of the lamp housing while covering the LEDs on the PCB,
   wherein a pattern portion for diffusing the LED light is formed at a bottom of the diffusion cap, and
   wherein the pattern portion comprises:
      a sparse pattern portion formed in a first region corresponding to a position of the LEDs and having a predetermined number of patterns on the first region; and
      a dense pattern portion formed in a second region corresponding to a position between the LEDs and having a larger number of patterns than the predetermined number of the sparse pattern portion on the second region.

2. The charging status indicator of claim 1, wherein the lens of the lamp housing is formed in a quadrangular projection shape, and an upper end of the diffusion cap is received in the lens and positioned adjacent to the lens therein.

3. The charging status indicator of claim 2, wherein the lens of the lamp housing comprises a black smog lens in order to solve a vague reflection problem.

4. The charging status indicator of claim 1, wherein a heat sink thermal conductive film transferring heat generated from the LEDs and a microcomputer configured to be attached on the PCB to a heat sink side formed at a bottom of the PCB housing is attached to a bottom of the PCB and dissipation of the heat is performed by a thermal conducting method.

5. The charging status indicator of claim 1, wherein the LEDs comprise a Red, Green, Blue (RGB) LED in which the charging status is indicated through color conversion.

6. The charging status indicator of claim 1, wherein the lens of the lamp housing comprises a black smog lens in order to solve a vague reflection problem.

7. The charging status indicator of claim 1, wherein the diffusion cap is a rectangular cap in a lens shape of the lens-integrated lamp housing.

8. The charging status indicator of claim 1, wherein the sparse pattern portion is formed in a region corresponding to a directly upper portion of a portion where the LEDs are positioned in an upper region of the diffusion cap, and the dense pattern portion is formed in a region corresponding to a directly upper portion between the LEDs.

9. The charging status indicator of claim 1, wherein the pattern portion is formed in a dotted shape including a convex shape or a concave shape.

10. The charging status indicator of claim 1, wherein the diffusion cap has an edge portion formed in a rounded shape to reduce a refractive index difference, thereby improving uniform distribution of light irradiation and a shaded edge and increasing a volume of the lens.

11. The charging status indicator of claim 1, wherein the sparse pattern portion and the dense pattern portion are configured to extend toward the LEDs in a predetermined length.

* * * * *